US012560317B2

(12) United States Patent
Engelen et al.

(10) Patent No.: US 12,560,317 B2
(45) Date of Patent: Feb. 24, 2026

(54) ADAPTIVE ILLUMINATION FOR LED ARRAYS

(71) Applicant: Lumileds Singapore Pte. Ltd.,
Singapore (SG)

(72) Inventors: Rob Jacques Paul Engelen, Eindhoven (NL); Mehdi Aas, Eindhoven (NL)

(73) Assignee: Lumileds Singapore Pte. Ltd.,
Singapore (SG)

( * ) Notice: Subject to any disclaimer, the term of this patent is extended or adjusted under 35 U.S.C. 154(b) by 0 days.

(21) Appl. No.: 18/574,690

(22) PCT Filed: Jun. 28, 2022

(86) PCT No.: PCT/US2022/035322
§ 371 (c)(1),
(2) Date: Dec. 27, 2023

(87) PCT Pub. No.: WO2023/278450
PCT Pub. Date: Jan. 5, 2023

(65) Prior Publication Data
US 2024/0360991 A1    Oct. 31, 2024

Related U.S. Application Data

(60) Provisional application No. 63/215,576, filed on Jun. 28, 2021.

(51) Int. Cl.
*F21V 23/04*        (2006.01)
*F21V 5/00*         (2018.01)
(Continued)

(52) U.S. Cl.
CPC .......... *F21V 23/0478* (2013.01); *F21V 5/004* (2013.01); *F21V 5/007* (2013.01);
(Continued)

(58) Field of Classification Search
CPC ......... F21V 5/004; F21V 5/007; F21V 23/005
See application file for complete search history.

(56) References Cited

U.S. PATENT DOCUMENTS 9,722,145 B2    8/2017  Sasaki et al.
9,755,110 B1    9/2017  Crowder et al.
                (Continued)

FOREIGN PATENT DOCUMENTS

WO      WO-2023278450 A1      1/2023

OTHER PUBLICATIONS

"European Application Serial No. 22834067.5, Response to Communication Pursuant to Rules 161 and 162 EPC filed Aug. 6, 2024", 11 pgs.
(Continued)

*Primary Examiner* — William N Harris
(74) *Attorney, Agent, or Firm* — Schwegman, Lundberg & Woessner, P.A.

(57)            ABSTRACT

A structure and method of operating micro-LEDs are described. The micro-LEDs are arranged in a micro-LED array and have random orientations, distributions, and positions within the array. A lens array includes micro-lenses configured to capture light from the micro-LEDs. The micro-LED array structure is calibrated by capturing light from each of the micro-LEDs at different times and determining characteristics of the light from each of the micro-LEDs. Once image data of an image to be generated by the micro-LED array is received, a combination of the micro-LEDs to activate to produce the image, as well as the characteristics for driving the individual micro-LEDs is determined. The micro-LEDs are then activated to produce the image.

17 Claims, 13 Drawing Sheets

(51) Int. Cl.

| | |
|---|---|
| *F21V 23/00* | (2015.01) |
| *F21Y 113/13* | (2016.01) |
| *F21Y 115/10* | (2016.01) |
| *H01L 25/16* | (2023.01) |
| *H04N 9/31* | (2006.01) |
| *H05B 45/20* | (2020.01) |
| *H10H 29/30* | (2025.01) |
| *H10H 29/855* | (2025.01) |
| *H10H 29/856* | (2025.01) |

(52) U.S. Cl.
CPC .......... *F21V 23/005* (2013.01); *H01L 25/167* (2013.01); *H04N 9/3138* (2013.01); *H04N 9/3155* (2013.01); *H04N 9/3158* (2013.01); *H04N 9/3179* (2013.01); *H04N 9/3194* (2013.01); *H05B 45/20* (2020.01); *H10H 29/30* (2025.01); *H10H 29/855* (2025.01); *F21Y 2113/13* (2016.08); *F21Y 2115/10* (2016.08); *H10H 29/856* (2025.01)

(56) References Cited

U.S. PATENT DOCUMENTS

| | | | | |
|---|---|---|---|---|
| 10,941,919 | B1 * | 3/2021 | Hong ...................... | F21V 5/004 |
| 2002/0034710 | A1 * | 3/2002 | Morris ................. | G02B 5/0221 |
| | | | | 430/945 |

| | | | | |
|---|---|---|---|---|
| 2004/0130790 | A1 * | 7/2004 | Sales .................. | G02B 27/0961 |
| | | | | 359/619 |
| 2012/0127710 | A1 * | 5/2012 | Jurik ...................... | F21V 11/16 |
| | | | | 362/235 |
| 2013/0329299 | A1 * | 12/2013 | Kim ..................... | G02B 3/0043 |
| | | | | 359/619 |
| 2016/0218257 | A1 | 7/2016 | Ray et al. | |
| 2017/0163977 | A1 | 6/2017 | Fleck et al. | |
| 2018/0090058 | A1 | 3/2018 | Chen et al. | |
| 2019/0337449 | A1 | 11/2019 | Diana et al. | |
| 2020/0200357 | A1 * | 6/2020 | Gray ...................... | F21V 5/008 |
| 2021/0190481 | A1 | 6/2021 | Kakkar | |
| 2021/0193889 | A1 | 6/2021 | Kim | |

OTHER PUBLICATIONS

"International Application Serial No. PCT/US2022/035322, International Search Report mailed Nov. 15, 2022", 4 pgs.

"International Application Serial No. PCT/US2022/035322, Invitation to Pay Additional Fees mailed Sep. 20, 2022", 2 pgs.

"International Application Serial No. PCT/US2022/035322, Written Opinion mailed Nov. 15, 2022", 7 pgs.

"European Application Serial No. 22834063.4, Extended European Search Report mailed Apr. 16, 2025", 18 pgs.

"European Application Serial No. 22834063.4, Response filed Oct. 20, 2025 to Extended European Search Report mailed Apr. 16, 2025", W/ English Claims, 60 Pgs.

* cited by examiner $$\theta = 2\mathrm{atan}\left(\frac{d}{2f}\right)$$

ADAPTIVE ILLUMINATION FOR LED ARRAYS

CLAIM OF PRIORITY

This application is a U.S. National Stage Filing under 35 U.S.C. 371 from International Application No. PCT/US2022/035322, filed Jun. 28, 2022 and published in English as WO 2023/278450 on Jan. 5, 2023, which claims the benefit of U.S. Provisional Application No. 63/215,576, filed on Jun. 28, 2021, each of which is hereby incorporated by reference in its entirety.

TECHNICAL FIELD

The present disclosure relates generally to light-emitting diodes (LEDs) and LED arrays, and, more specifically, to adaptive illumination using micro-LED arrays.

BACKGROUND

The field of micro-light-emitting diode (micro-LED) arrays is an emerging technology in lighting and display industries. Micro-LED arrays often include thousands to millions of microscopic light-emitting diode (LED) pixels that can emit light and that can be individually controlled or controlled in groups of pixels (e.g., 5×5). Micro-LED arrays may provide higher brightness and better energy efficiency than other lighting technologies and display technologies, which can make the Micro-LED arrays desirable for multiple different applications, such as televisions, automotive headlamps, and mobile phones among others.

BRIEF DESCRIPTION OF THE DRAWINGS

To provide a more complete understanding and features and advantages thereof, reference is made to the following description, taken in conjunction with the accompanying figures, wherein like reference numerals represent like parts, in which.

DETAILED DESCRIPTION

The systems, methods, and devices of this disclosure may include one or more innovative aspects, where the innovative aspects may individually or in combination contribute to the desirable attributes disclosed herein. Details of one or more implementations of the subject matter described in this specification are set forth in the description below and the accompanying drawings.

Figure 1B:
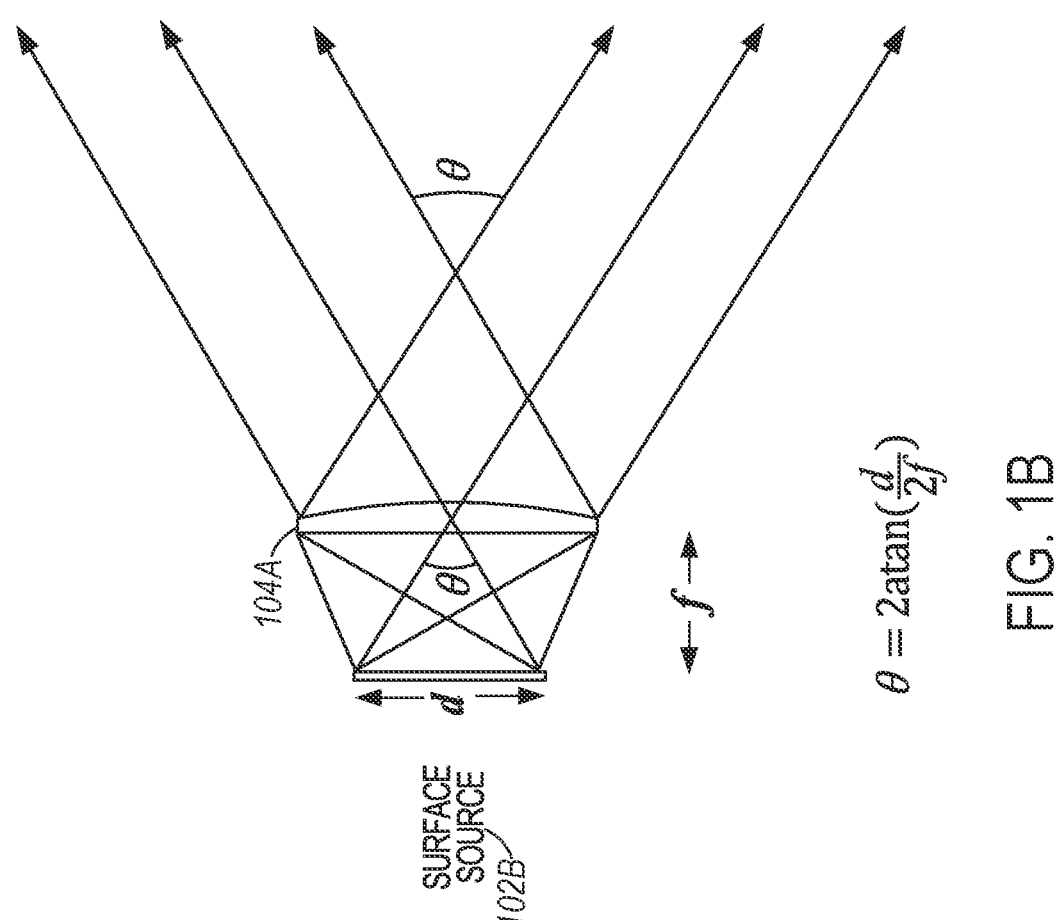
FIG. 1B illustrates an extended light source and lens combination, according to some embodiments.
Figure 1A:
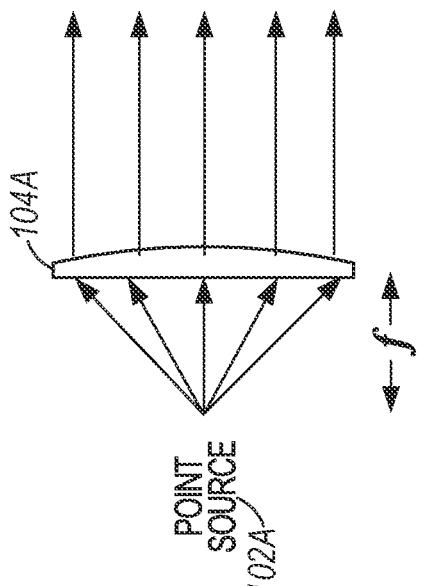
FIG. 1A illustrates a point light source and lens combination, according to some embodiments.

Light emission from incoherent light sources such as incandescent lamps or LEDs have a Lambertian luminance profile. To increase the energy efficiency of illumination systems using such light sources, additional optics around the light source may be used to direct the emitted light toward a desired region. The optics around the source can include a reflecting element and/or refracting element that intersects at least the main area of the light emission. The reflecting element may partially surround the light source to reflect light towards the main area. The optics capability to control the light source intensity profile may be proportional to the size of the optics relative to the size of the light source. For example, a point source located at the focal point of a lens can generate a parallel beam of light. The plane perpendicular to the lens axis at the focal point is the focal plane. FIG. 1A illustrates a point light source and lens combination, according to some embodiments. As shown in FIG. 1A, the light from the point light source 102a is collimated by the lens 104a, resulting in a parallel beam of light emitted by the lens 104a.

By increasing the source size, the beam angle may increase. FIG. 1B illustrates an extended light source and lens combination, according to some embodiments. As illustrated in FIG. 1B, a surface light source 102b having an emission surface d units long is used rather than a point light source 102a. The size of the surface light source 102b causes the light from lens 104a to be spread. If the surface light source 102b is located at the focus f of the lens 104a, the angle of extension of the light from the lens 104a may be estimated using:

$$\theta = 2 \arctan\left(\frac{d}{2f}\right) \qquad \text{Equation (1)}$$

LEDs are typically fabricated having a size of several (e.g., 5) mm on a side. Micro-LEDs may be used, which have a size range of a few micrometers to tens of micrometers on each side may be used as minimized sources with optics to build adaptive illuminators. Since the radiant flux of micro-LEDs scale with their size, for illumination purposes, a large number of micro-LEDs may be used simultaneously for an illuminator.

An illuminator having a tunable radiation pattern may include a large number of LEDs (including micro-LEDs) with each having its own optic. Each pair of LED and lens produces a directional beam in different centroid angles. Selective activation (or partial activation) of each LED or group of LEDs in the illuminator can allow tuning of the radiation pattern of the illuminator.

One design issue in the above illuminator is alignment between small optical elements (lenses) and sources (LEDs).

Micro and nano lithography methods help to facilitate the fabrication of the micro-LEDs in arrays however, the mechanical tolerances for isolated micro-LED array alignment is exposed with minimum limit constraints. Micro-LEDs span a size range of a few micrometers to about 70 μm. A luminaire containing the illuminator may consist of a few thousand to a few million micro-LED components. Using conventional pick-and-place machines for array construction of such tiny components may be extremely time consuming and costly and moreover may result in inaccurate micro-LEDs placement.

Figure 2:
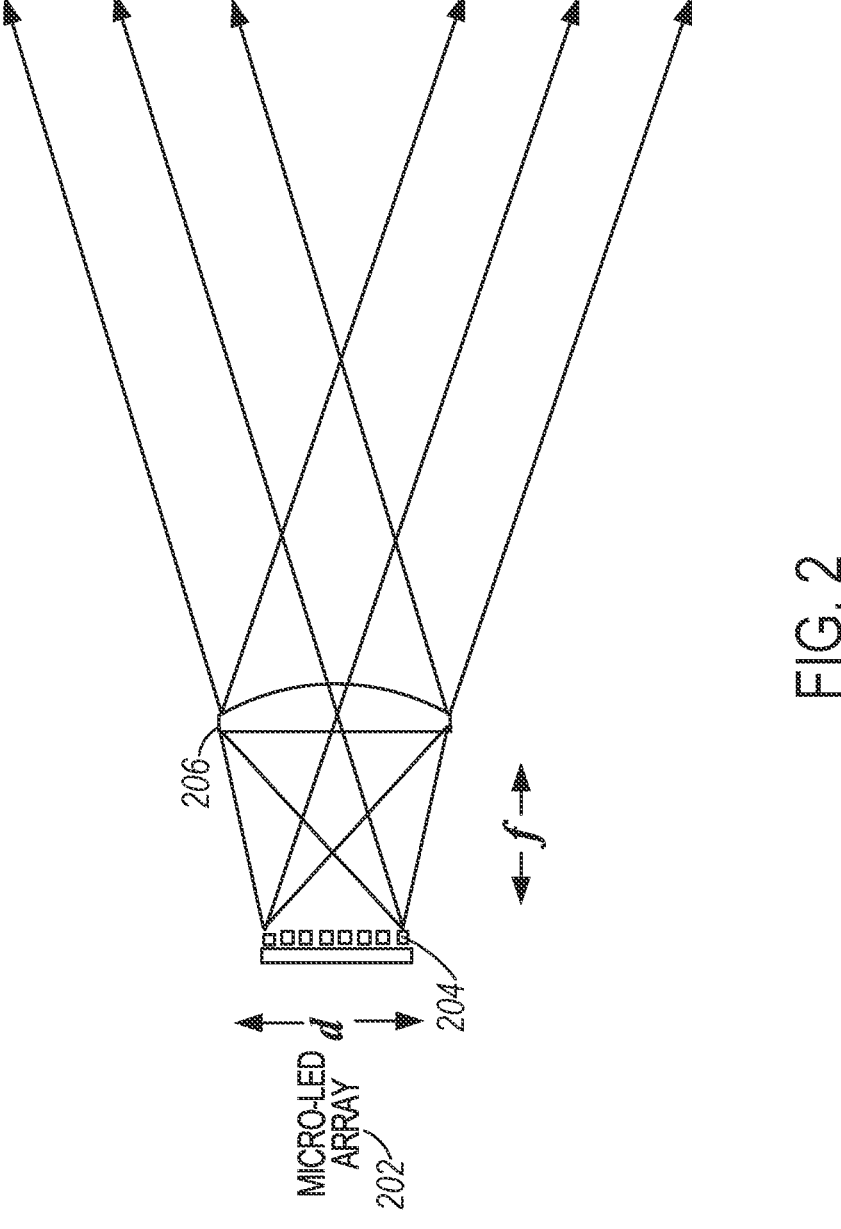
FIG. 2 illustrates a micro-LED array and lens combination, according to some embodiments.

FIG. 2 illustrates a micro-LED array and lens combination, according to some embodiments. As illustrated in FIG. 2, a micro-LED array 202 contains a plurality of micro-LEDs 204 that are positioned uniformly throughout the micro-LED array 202. The micro-LED array 202 may be formed in any desired shape, such as a rectangular array—for example a square array. The micro-LEDs 204 may emit light of the same or of a different wavelength. The light emitted by each micro-LED 204 may be in the visible spectrum (e.g., red, blue, green) or in the infrared (IR) or ultraviolet (UV) spectrum; the micro-LED array 202 may thus contain micro-LEDs 204 that emit over a variety of wavelengths. The emission surface of the micro-LED array 202 over which the micro-LEDs 204 extend is d units long. The micro-LED array 202 is located at the focus f of the lens 206. Each micro-LED 204 may be able to individually be switched on and off to steer the whole beam from the micro-LED array 202. For example, when a micro-LED 204 in the middle of the micro-LED array 202 is turned on, and the micro-LED 204 in the middle of the micro-LED array 202 is aligned with the center of the lens 206, the light from the lens 206 may also be along the axis of symmetry of the lens 206. In another example, the light from a corner-mounted one of the micro-LEDs 204 may leave the lens 206 collimated, but under an angle (centroid angle).

As used herein, LEDs, micro-LEDs, and micro-LED pixels (which may contain multiple micro-LEDs) may be referred to as being "turned on" and being "turned off." The term "turned on" may refer to the state, or the transition to the state, where current is allowed to flow through the LEDs, the micro-LEDs, and/or the micro-LED pixels. The term "turned off" may refer to the state, or the transition to the state, where current is prevented from flowing through the LEDs, the micro-LEDs, and/or the micro-LED pixels. In some embodiments, a micro-LED array may include thousands or millions of light emitting LEDs positioned together on centimeter scale area substrates or smaller. Each pixel may comprise a micro-LED as described herein. The micro-LED arrays can support high density pixels having a lateral dimension of less than about 100 μm by 100 μm (for example, about 10-20 μm on a side). As used herein, a micro-LED refers to an independently-controllable LED. Alternatively, or in addition, a micro-LED refers to an LED having lateral dimensions of about 1 to about 100 μm. For example, a micro-LED array may have lateral dimensions of about 50 μm in diameter, width, or other characteristic dimension.

Each micro-LED may emit light when current is applied through the LED. An intensity of light emitted by the LED may be dependent on the amount of current applied through the LED. For example, the less current applied through the LED, the less the intensity of the light emitted by the LED. Conversely, the greater the current applied through the LED, the greater the intensity of the light emitted by the LED.

Figure 3:
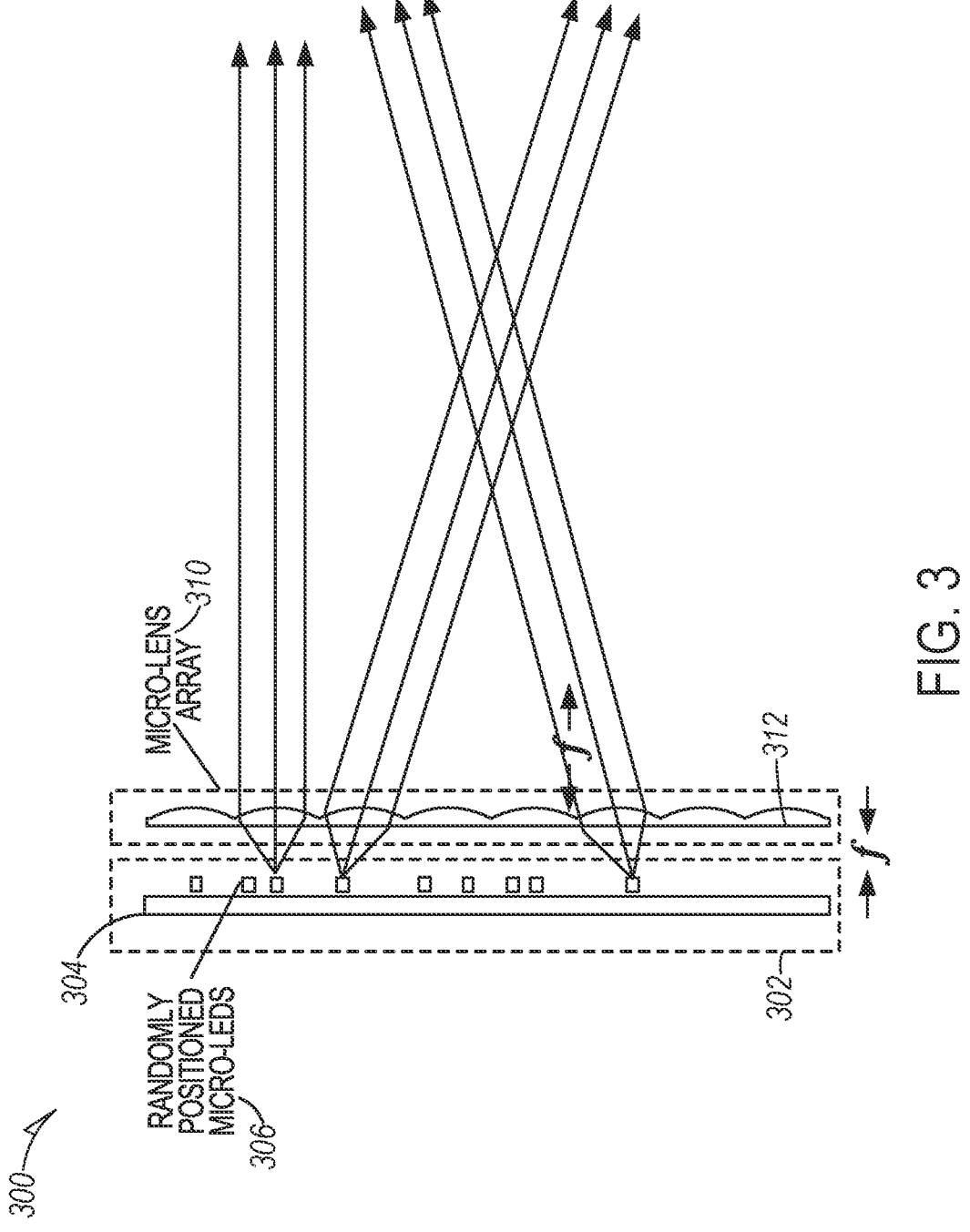
FIG. 3 illustrates another micro-LED array and lens combination, according to some embodiments.

FIG. 3 illustrates another micro-LED array and lens combination, according to some embodiments. As shown in FIG. 3, the structure 300 includes a micro-LED array 302 and a micro-lens array 310. The micro-LED array 302 contains a plurality of micro-LEDs 306 disposed on a supporting structure, such as a backplane 304. The micro-LED array 302 may contain tens of thousands to millions of micro-LEDs 306. Unlike the arrangement of FIG. 2, the micro-LEDs 306 in the micro-LED array 302 are positioned randomly throughout the micro-LED array 302. The micro-LEDs 306 in the micro-LED array 302 may be placed randomly throughout the micro-LED array 302.

The micro-LEDs 306 may be divided into sections. The sections themselves may be universal in size and shape or may have different sizes and/or shapes. As the micro-LED array 302 may contain tens of thousands or millions of the micro-LEDs 306, each section may itself contain thousands of micro-LEDs 306. Each section may contain one or more pixels. Each pixel of the micro-LED array 302 may be a predetermined size and may have one or more micro-LEDs 306 therein. In some embodiments, the micro-LEDs 306 in each section and/or each pixel may be controlled as a unit (rather than or in addition to individual ones of the micro-LEDs 306) to emit light. Even though the micro-LEDs 306 are disposed randomly (e.g., being immersed in and free to move around in a liquid), as above, the micro-LED array 302 itself may be formed in any desired shape, such as a rectangular array—for example a square array. The randomly-positioned ones of the micro-LEDs 306 may emit light of the same wavelength or different micro-LEDs 306 within the same cell may emit light of different wavelengths. Each micro-LED 306 may be able to individually be switched on and off to steer the whole beam from the micro-LED array 302.

In some embodiments, the micro-LEDs 306 may be self-assembled within the micro-LED array 302 by, after semiconductor fabrication of the micro-LEDs 306, separating the individual ones of the micro-LEDs 306 such as by dissolving areas between the micro-LEDs 306 using a solvent. The micro-LEDs 306 may then be immersed in a liquid carrier and deposited randomly on landing pads of a backplane 304. In some embodiments, electrostatic attraction may be used to enable contact between the micro-LEDs 306 and the backplane 304. Such a process can be used to deposit the micro-LEDs on well-defined or random locations of the backplane 304, which may be, for example, a printed circuit board (PCB) or thin film transistor (TFT) plane.

A micro-lens array 310 or any other type of secondary optic can be placed to oppose the randomly assembled micro-LEDs. The micro-lens array 310 contains multiple lenses 312 that may cover the entire surface of the micro-LED array 302. The micro-lens array 310 may be fabricated, for example, by adhering the lenses 312 together using a transparent adhesive when the lenses 312 are supported by a backplane and then removing the backplane once the lenses 312 are fixed. Each of the multiple lenses 312 may be relatively large in comparison to the micro-LED 306, e.g., about 100 μm-about 500 μm in diameter. In some embodiments, each of the multiple lenses 312 may be substantially identical (e.g., diameter, shape, focal length). In some embodiments, each of the multiple lenses 312 may be, for example, a plano-concave or convex lens or a Fresnel lens or any other suitable optical element that affects the directionality of the light from the micro-LED array 302. Each of the multiple lenses 312 may have at least one coating, such as a UV blocking or anti-reflective coating. In some embodiments, the multiple lenses 312 may be designed to polarize the light transmitted therethrough. An aperture and/or filter may be used in addition to the multiple lenses 312. The multiple lenses 312 may also be used (or a separate optical element may be used) to magnify and/or correct images, such as correction or minimization of various two- or three-dimensional optical errors.

The combination of the micro-LED array 302 and the micro-lens array 310 may be disposed within a cavity of a housing (not shown) to permit light from the micro-lens array 310 to be directed external to the array structure. Each of the multiple lenses 312 may be positioned to intercept light from one or more of the micro-LEDs 306. As shown, each of the micro-LEDs 306 whose light is intercepted by one of the multiple lenses 312 may be randomly positioned at one of a number of predetermined positions within the range of the overlying ones of the multiple lenses 312. In some embodiments, the distribution of micro-LEDs 306 may be substantially uniform within each cell of the micro-LED array 302, even if within sections of the cells, the distribution is not particularly uniform due to the random placement. The micro-LEDs 306 may also be randomly oriented with respect to the parallel planes of the micro-LED array 302 and micro-lens array 310. Accordingly, the micro-LEDs 306 may have random orientation, distribution, and/or positions on the underlying support structure.

The micro-LED array 302 may be located at the focus f of each of the multiple lenses 312. That is, the focal lengths of the multiple lenses 312 may coincide with the plane in which the micro-LEDs 306 are mounted. The focal lengths of the multiple lenses 312 of the micro-LED array 302 may be, for example, about 100 μm to about 5 mm. The light from each of the individual ones of the micro-LEDs 306 may have a unique beam angle and centroid angle. The individual one of the micro-LEDs 306 can be powered individually. The superposition of the light from all of the micro-LEDs 306 allows for tuning of the radiation pattern of the whole assembly.

In some embodiments, high speed and high data rate operation of an image display is supported. In some embodiments, successive images may be able to be projected in an image sequence at a rate between about 30 Hz and about 100 Hz, with about 60 Hz being typical.

Figure 4:
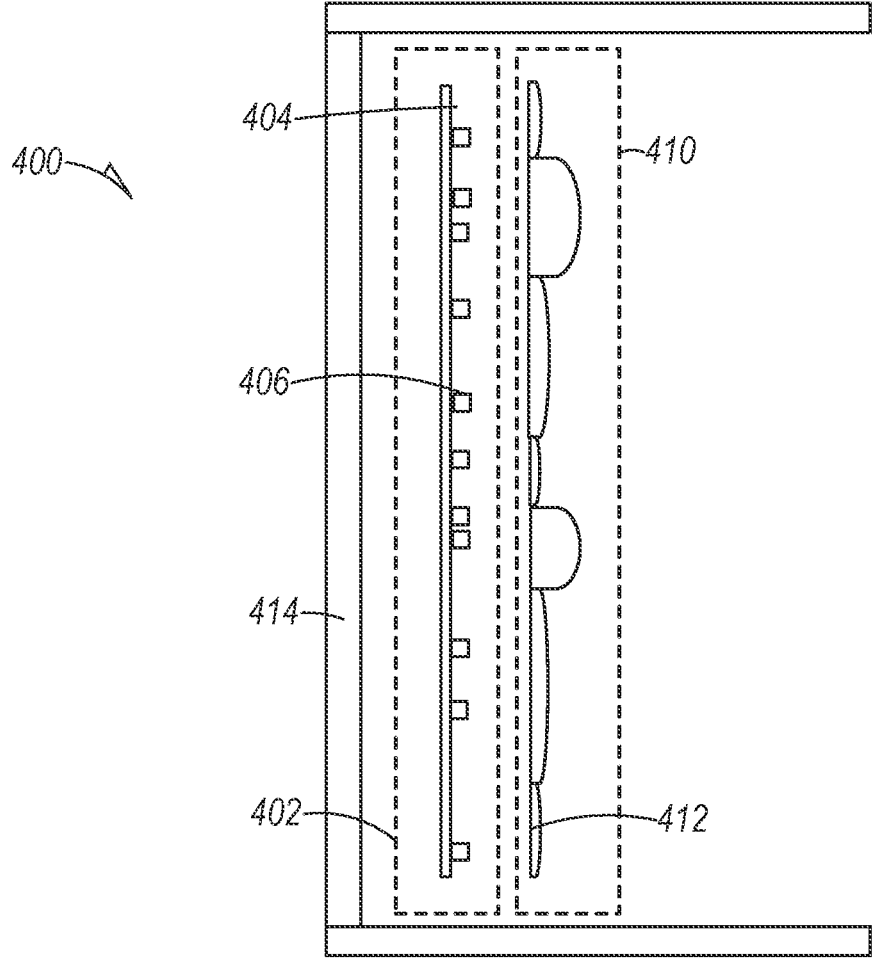
FIG. 4 illustrates another micro-LED array and lens combination, according to some embodiments.

FIG. 4 illustrates another micro-LED array and lens combination, according to some embodiments. The structure 400 of FIG. 4, like that of FIG. 3, includes a micro-LED array 402 and a micro-lens array 410. The micro-LED array 402 contains a plurality of micro-LEDs 406 disposed on a supporting structure 404. In this embodiment however, unlike the embodiment shown in FIG. 3, rather than each lens 412 of the micro-lens array 410 being substantially identical, one or more of the characteristics of the lenses 412, e.g., diameter, shape, focal length, pitch, and/or position, may also be random. Even if one or more of the characteristics are randomized, however, the micro-lens array 410 may still be disposed in a single plane, that is, at the same distance from the micro-LED array 402 for ease of fabrication and other reasons. Each lens 412 shape may be the same (even if one or more of the characteristics are randomized) or may also be randomized within a predetermined set of shapes.

In some embodiments of the embodiments shown in FIGS. 3 and 4, reflectors may be disposed at edges of the micro-LED array 302, 402 or between cells of the micro-LED array 302, 402. The reflectors may direct light from micro-LEDs 306, 406 towards the micro-lens array 310, 410.

Figure 5D:
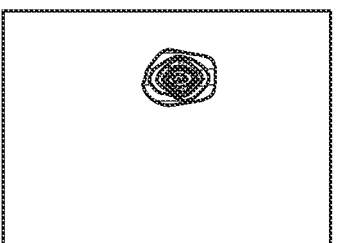
FIGS. 5A-5H illustrate simulated illumination patterns of a combination of randomly placed micro-LEDs and lenses, according to some embodiments.
Figure 5H:
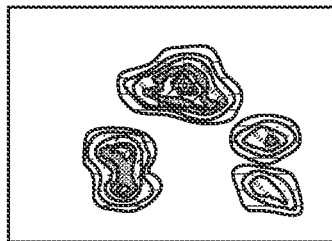
Figure 5C:
Figure 5G:
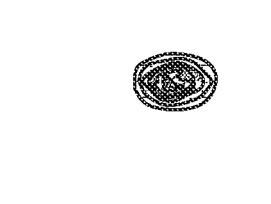
Figure 5B:
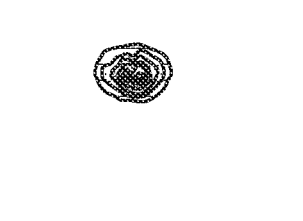
Figure 5F:
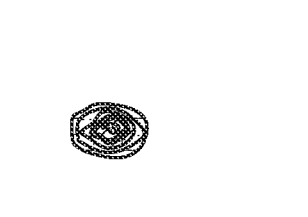
Figure 5A:
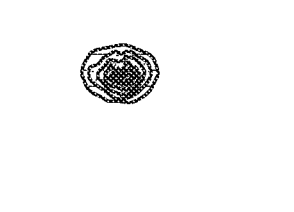
Figure 5E:

FIGS. 5A-5H illustrate simulated illumination patterns of a combination of randomly placed micro-LEDs and lens, according to some embodiments. In particular, FIGS. 5A-5H illustrate simulated illuminance patterns of seven randomly positioned micro-LEDs behind a lens array illuminating on a 4 m×4 m flat surface. FIG. 5H shows the overlap of illuminance from all seven micro-LEDs (FIGS. 5A-5G) when turned on simultaneously.

Figure 6:
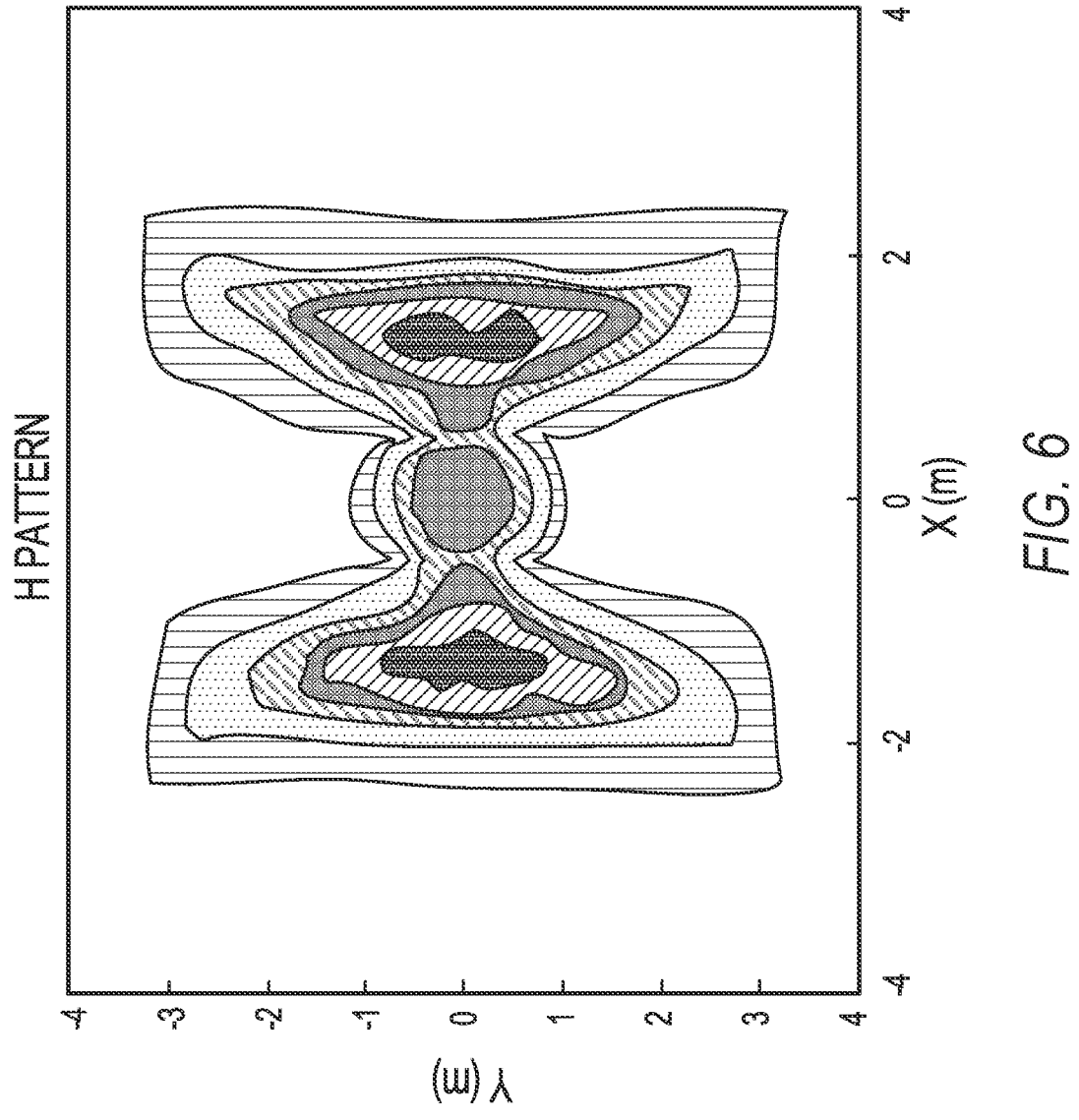
FIG. 6 illustrates a simulated illumination pattern using the arrangement of FIG. 3, according to some embodiments.

FIG. 6 illustrates a simulated illumination pattern using the arrangement of FIG. 3, according to some embodiments. In FIG. 6, a few selected micro-LEDs from 1000 randomly distributed micro-LEDs are used to generate an H pattern.

Figure 7:
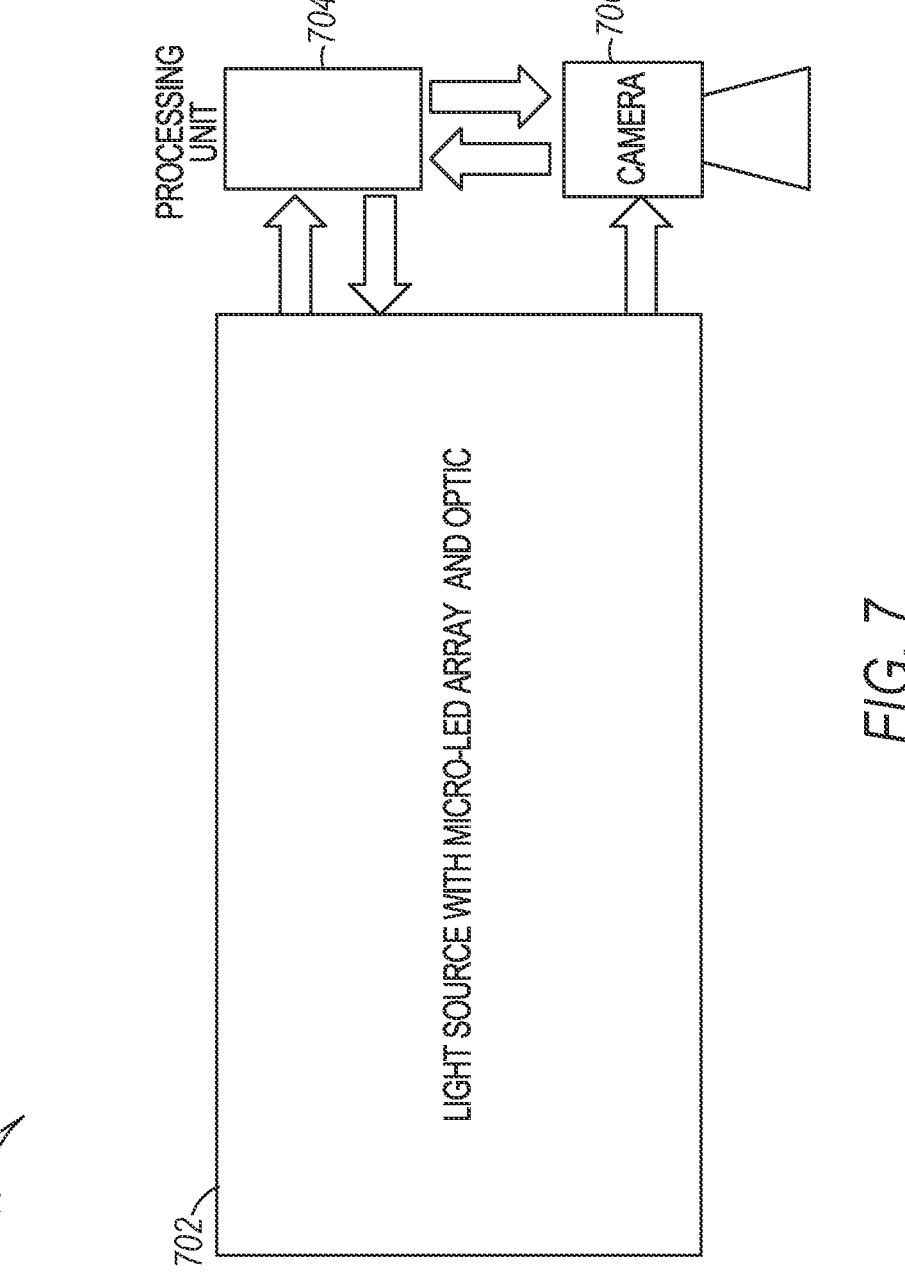
FIG. 7 illustrates a calibration arrangement, according to some embodiments.

FIG. 7 illustrates a calibration arrangement, according to some embodiments. In FIG. 7, the system 700 includes a light source 702. The light source 702 may contain a micro-LED array and optics, such as that shown in FIG. 3. The light source 702 may be a stand-alone device, such as a luminaire or projector, or may be incorporated in an electronic device, such as a mobile device (e.g., smartphone), or used as indoor lighting, such as in a room or vehicle. A processor 704 and a camera 706 or other sensor that is able to detect light from the micro-LED array may be used to calibrate the assembly. In such an arrangement, when the micro-LED array is disposed at the focal length of the optics, the light from each micro-LED may be collimated in a random direction towards the camera 706.

The illumination profile of each micro-LED may be limited to a small region of the illumination field detected by the camera 706. Although not shown, a power supply unit may provide power to each micro-LED individually, as controlled by the processor 704 during a calibration procedure. Using the camera 706, the pattern of light from an individual micro-LED may be recorded as a partial illumination component. That is, in some embodiments, during calibration the processor 704 may control the system such that power is provided to a single micro-LED and the partial illumination component of the micro-LED recorded. After recording the light from the micro-LED, power to the micro-LED may be turned off and power then provided to a new micro-LED, whose partial illumination component is then recorded. This may continue until the entire the partial illumination component from each micro-LED in the micro-LED array is recorded and stored in memory.

Once stored in memory, the partial illumination components may be used to generate a desired illumination profile. That is, for any arbitrary illumination profile (e.g., requested by a user), the processor 704 may be able to determine a linear combination of the micro-LEDs that generates the desired illuminance profile based on, for example, matrix inversion. Based on user-desired illumination color temperature and intensity profile, the processor 704 may calculate the currents for all the micro-LEDs and set the current for each micro-LED or set of micro-LEDs.

After calibration, image data may be provided to the processor 704. The image data defines an image to be displayed by the micro-LED array. The image data may be supplied by a user or may be stored and used to provide predefined images. To display and realize the image, the current levels of each micro-LED or each pixel within the micro-LED array may be adjusted accordingly to the image to be produced and/or a light profile. One approach for adjusting the current levels is to utilize pulse-width modulation (PWM) dimming. In particular, for PWM dimming the pixels within the micro-LED array may be turned on and off at a certain frequency and a ratio between the conduction time and the period or cycle time may be adjusted to produce duty cycles for the pixels.

As will be appreciated by one skilled in the art, aspects, in particular aspects of micro-LED arrays, described herein, may be embodied in various manners—e.g. as a method, a system, a computer program product, or a computer-readable storage medium. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module," or "system." Functions described in this disclosure may be implemented as an algorithm executed by one or more hardware processors, e.g. one or more microprocessors, of one or more computers. Although a processor is referred to herein, any logic capable of performing the functions indicated may be used. In various embodiments, different steps and portions of the steps of each of the methods described herein may be performed by different processors. Furthermore, aspects may take the form of a computer program product embodied in one or more computer-readable medium(s), such as a non-transitory medium, having computer-readable program code embodied, e.g., stored, thereon. In various embodiments, such a computer program may, for example, be downloaded (updated) to the existing devices and systems (e.g. to the existing lighting systems, etc.) or be stored upon manufacturing of these devices and systems.

Figure 8:
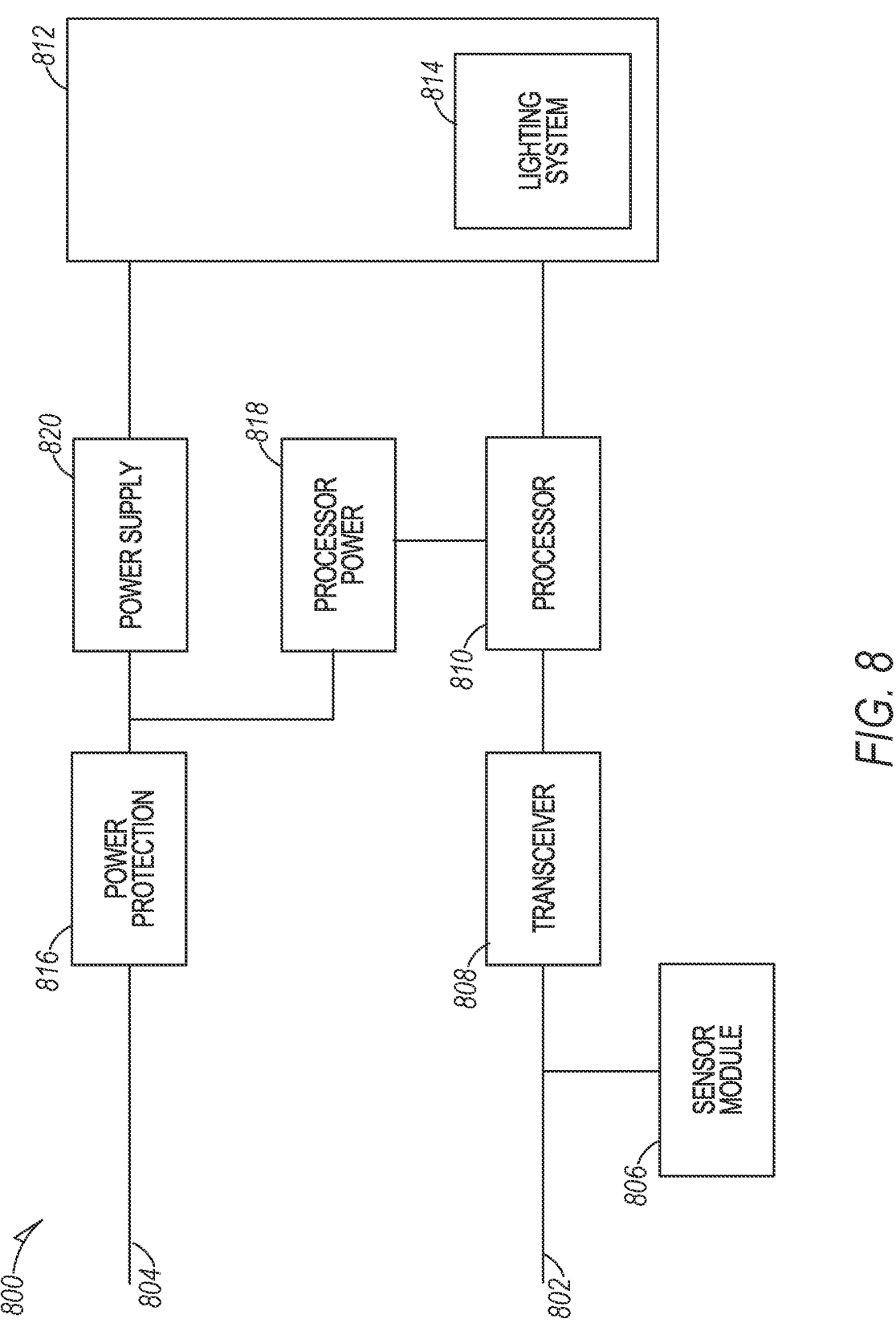
FIG. 8 illustrates an example system, according to some embodiments.

FIG. 8 illustrates an example system 800, according to some embodiments. In some of the embodiments, not all of the components shown in FIG. 8 may be present. The system 800 may be provided in any of the arrangements above, for example, in a luminaire, a mobile device or for indoor or outdoor lighting environs. In some embodiments, the system 800 may also be used in an active headlamp system, or in an augmented reality or a virtual reality device. In any of these applications, the intensity of light and/or an image provided by the light output by the system 800 may be adjusted as described above. The system 800 may implement a pixelated configuration made possible by the micro-LED array.

The system 800 may be coupled to a bus 802 of the apparatus and a power source 804. The power source 804 may provide power for the system 800. The bus 802 may be coupled to one or more components that can provide data and/or utilize data provided to or from the system 800. The data provided on the bus 802 may include, for example, image data of an image to be displayed, user control data (e.g., brightness, contrast adjustments), data related to external system sensors, such as environmental conditions around the system 800 (such as a time of day, whether there is rain, whether there is fog, ambient light levels, and other environmental data), among others. When the system 800 is in a vehicle and the lighting is provided for internal cabin lighting or display, for example, the data provided on the bus 802 may also be related to conditions of the vehicle (such as whether the vehicle is parked, whether the vehicle is in motion, a current speed of the vehicle, a current direction of travel of the vehicle), and/or presence/positions of other vehicles or pedestrians around the vehicle. The system 800 may provide feedback (such as information regarding operation of the system) to the components shown or other components of the device in which the system 800 resides.

The system 800 may further comprise a sensor module 806. In some embodiments, the sensor module 806 may include one or more sensors that can sense surroundings of the system 800. For example, the one or more sensors may sense surroundings that can affect an image to be produced by light emitted by the system 800. In embodiments in which the system 800 is disposed in a vehicle for example, the sensors may sense environmental conditions around the vehicle, and/or presence/positions of other vehicles or pedestrians around the vehicle if not already provided. In other embodiments, such as when the system 800 is disposed in a mobile device, the sensor module 806 may include one or more of an accelerometer, gyroscope, magnetometer, GPS, proximity sensor, ambient light sensor, microphone, touchscreen sensor, among others. The sensor module 806 may operate in combination with the data provided on the bus 802 or may operate in lieu of a portion of the data being provided on the bus 802. The sensor module 806 may output visually (and/or audibly and/or tactilely) data indicating that has been sensed by the sensors.

The system 800 may further include a transceiver 808. The transceiver 808 may have a universal asynchronous receiver-transmitter (UART) interface or a serial peripheral interface (SPI) in some embodiments. The transceiver 808 may also be coupled to the bus 802 and the sensor module 806, and may receive data from the bus 802 and the sensor module 806. In some embodiments, the transceiver 808 may multiplex the data received from the bus 802 and the sensor module 806. The transceiver 808 may direct feedback to the bus 802 or the sensor module 806.

The system 800 may further include a processor 810. The processor 810 may be a hardware processor (single or multiple core) that is coupled to the transceiver 808. The processor 810 may exchange data with the transceiver 808. For example, the processor 810 may receive data from the transceiver 808 that was provided by the bus 802 and/or the sensor module 806. The processor 810 may generate image data that indicates an image to be produced by light emitted from the system 800. The processor 810 may further generate one or more inquiries that request information from one or more of the components (shown or not shown) of the system 800. The processor 810 may further provide the feedback to the transceiver 808 to be directed to the bus 802 and/or the sensor module 806.

The system 800 may further include an illumination device 812. The illumination device 812 may produce multiple different outputs of light. The illumination device 812 may include a lighting system 814 that contains a micro-LED array (which, as above, may be several tens of thousands or more individual micro-LEDs). The illumination device 812 may be coupled to the processor 810 and may exchange data with the processor 810. In particular, the lighting system 814 may be coupled to the processor 810 and may exchange data with the processor 810. The lighting system 814 may receive the image data and inquiries from processor 810 and may provide feedback to the processor 810.

The system 800 may further include power protection 816. The power protection 816 may be coupled to the power source 804 and may receive power from the power source. The power protection 816 may include one or more filters that may reduce conducted emissions and provide power immunity. In some embodiments, the power protection 816 may provide electrostatic discharge (ESD) protection, load-dump protection, alternator field decay protection, reverse polarity protection, or some combination thereof.

The system 800 may further include processor power 818. The processor power 818 may be coupled to the power protection 816 and may receive power from the power source 804. The processor power 818 may comprise, for example, a low-dropout (LDO) regulator that may generate power for powering the processor 810 from the power provided by the power source 804. The processor power 818 may further be coupled to the processor 810 and may provide power to the processor 810.

The system 800 may further comprise a power supply 820. The power supply 820 may be coupled to the power protection 816 and may receive power from the power source 804. In some embodiments, the power supply 820 may comprise a converter that converts the power from the power source 804 to power for the illumination device 812. For example, the power supply 820 may comprise a direct current (DC)-to-DC converter that converts the power from the power supply 820 from a first voltage to a second voltage for the lighting system 814 of the illumination device 812.

Figure 9:
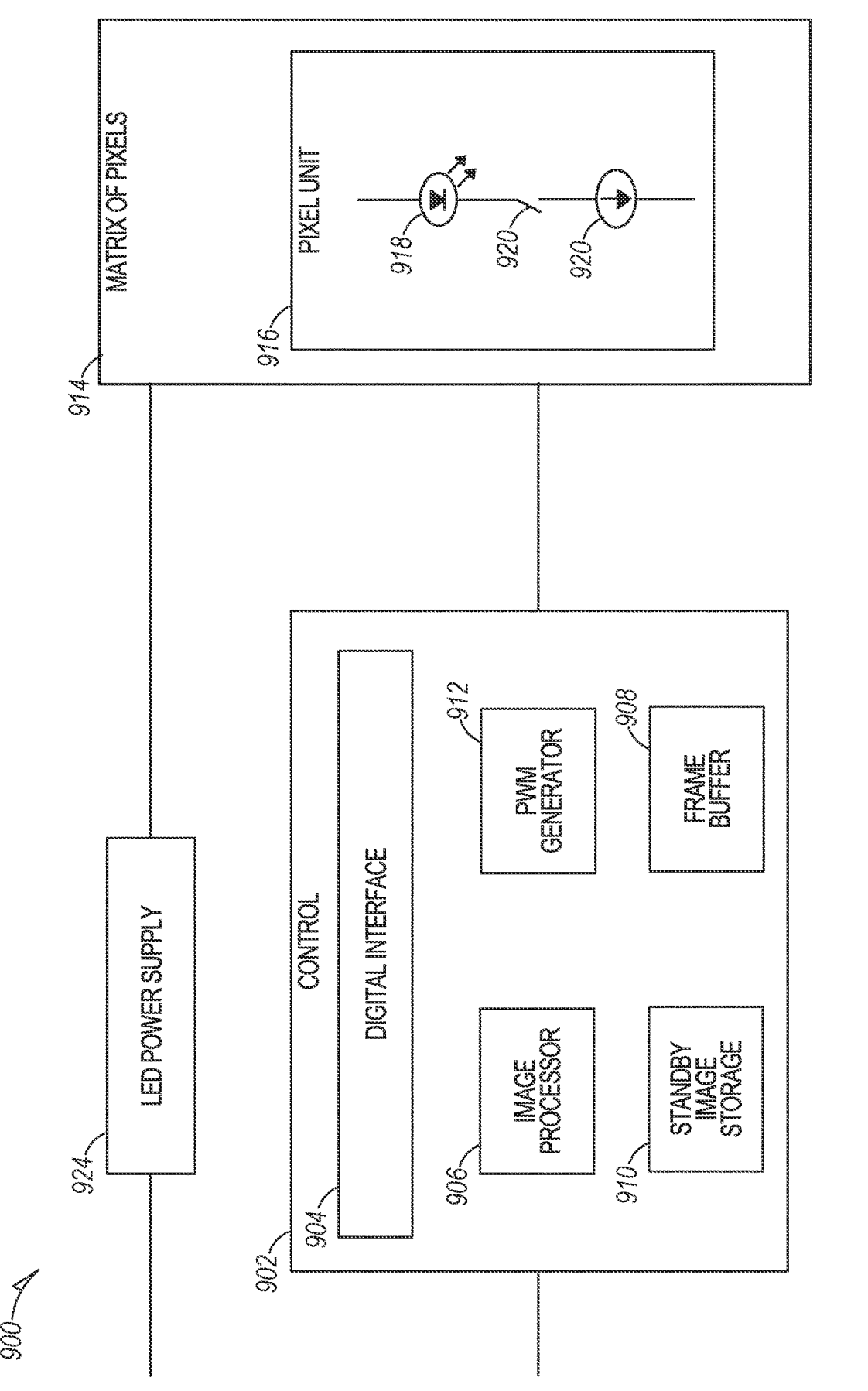
FIG. 9 illustrates an example lighting system, according to some embodiments.

FIG. 9 illustrates an example lighting system 900, according to some embodiments. As above, some of the elements shown in the lighting system 900 may not be present, while other additional elements may be disposed in the lighting system 900. The system 800 shown in FIG. 8 may include one or more of the features of the lighting system 900. The lighting system 900 may include a control module 902. In some embodiments, some or all of the components described as the control module 902 may be disposed on, for example, a compound metal oxide semiconductor (CMOS) backplane. The control module 902 may be coupled to or include the processor 810 of the overall system 800 shown in FIG. 8. The control module 902 may receive image data and inquiries from the processor 810. The control module 902 may further provide feedback to the processor 810.

The control module 902 may include a digital interface 904. The digital interface 904 may facilitate communication with the processor and other components within the lighting system 900. For example, the digital interface 904 may comprise an SPI interface in some embodiments, where the SPI interface may facilitate communication.

The control module 902 may further include an image processor 906. The image processor 906 may be a dedicated processor that is different from, or may be the same as, the processor 810 shown in FIG. 8. The image processor 906 may receive the image data via the digital interface 904 and may process the image data to produce indications of, for example, PWM duty cycles and/or intensities of light for causing the lighting system 900 to produce the images indicated by the image data based on the calibration described above.

The control module 902 may further include a frame buffer 908 and a standby image storage 910. The frame buffer 908 may receive the indications produced by the image processor 906 and store the indications for implementation. The standby image storage 910 may further store indications of PWM duty cycles, intensities of light, and/or turn-on times. The indications stored in the standby image storage 910 may be implemented in the absence of indications stored in the frame buffer 908. For example, the frame buffer 908 may retrieve the indications from the standby image storage 910 when the frame buffer 908 is empty.

The control module 902 may further include a PWM generator 912. The PWM generator 912 may receive the indications from the frame buffer 908 and may produce PWM signals in accordance with the indications. The PWM generator 912 may further determine intensities of light based on the indications and produce a signal to cause the intensities of light to be produced.

The lighting system 900 may include a micro-LED array 914. The micro-LED array 914 may include a plurality of pixels, where each of the pixels includes a pixel unit 916 that may be controlled individually or in groups of pixel units 916. In particular, the pixel unit 916 may include an LED 918, a PWM switch 920, and a current source 922. The pixel unit 916 may receive the signals from the PWM generator 912. The PWM signal from the PWM generator 912 may cause the PWM switch 920 to open and close in accordance with the value of the PWM signal. The signal corresponding to the intensities of light may cause the current source 922 to produce a current flow to cause the LED 918 to produce the corresponding intensities of light.

The lighting system 900 may further include an LED power supply 924. In some embodiments, the LED power supply 924 may be coupled to the power supply 820 and may receive power from the power supply 820. The LED power supply 924 may produce power for the LEDs of the micro-LED array 914. The LED power supply 924 may be coupled to the micro-LED array 914 and may provide the power for the LEDs to the micro-LED array 914.

Figure 10:
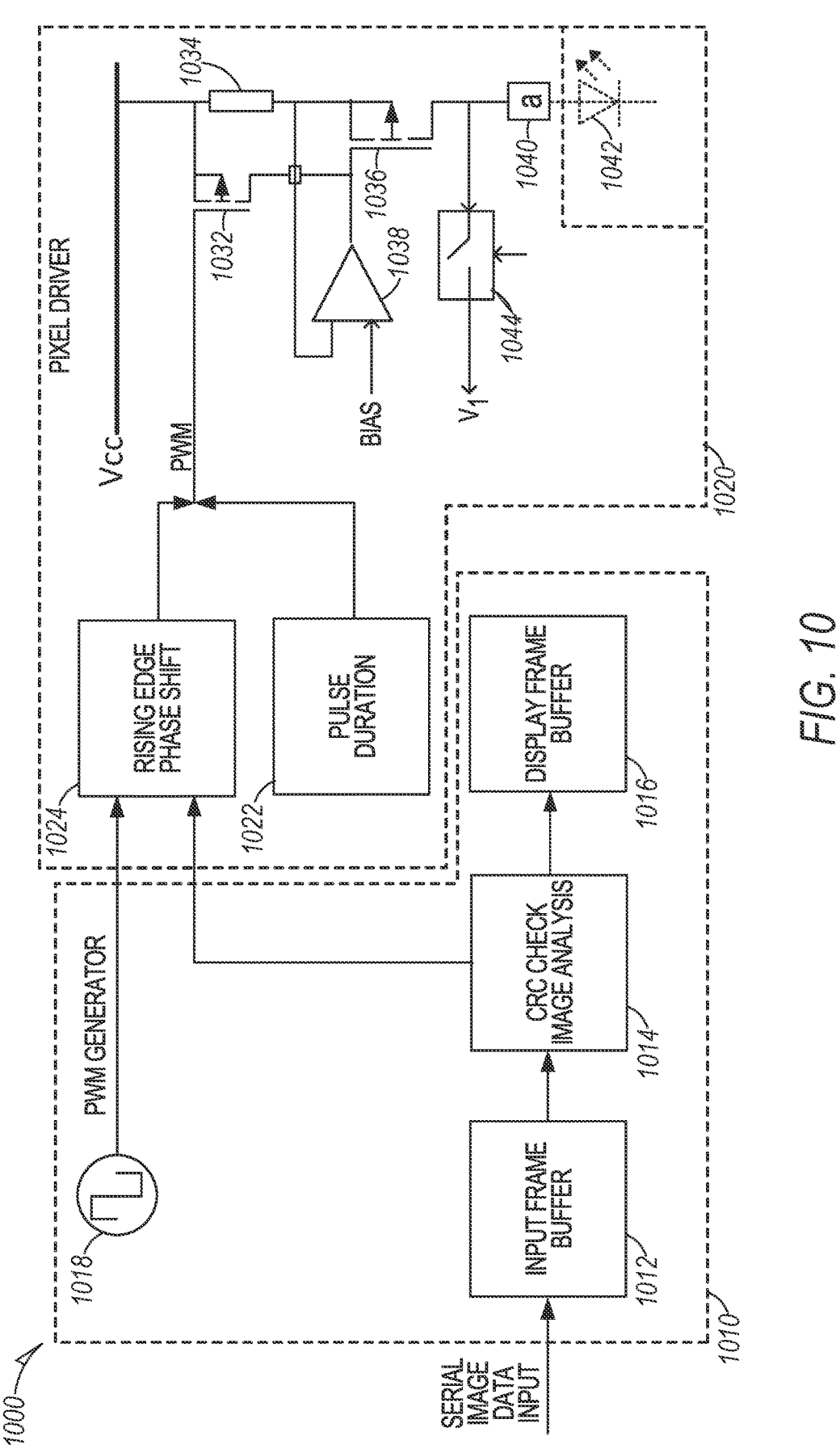
FIG. 10 illustrates an example hardware arrangement for implementing the lighting system, according to some embodiments.

FIG. 10 illustrates an example hardware arrangement for implementing the system, according to some embodiments. As above, only one embodiment of the hardware arrangement is shown; in other embodiments, some of the elements may not be present or other elements may be added. In particular, the hardware arrangement 1000 of FIG. 10 shows further specifics of the control module 902 and the micro-LED array 914 of the lighting system 900 as described above. Note that not all elements may be shown, such as the processor and memories used to provide the functionality of the various modules shown in FIG. 10. In some embodiments, the circuitry shown in FIG. 10 may be provided on, for example, a CMOS backplane.

The control module 1010 may be supplied with data to control the LEDs 1042. In particular, the control module 1010 contains an input frame buffer 1012 having an input to which serial image data to be provided for display may be received via the digital interface. The serial image data may include indications produced by the image processor (not shown). The input frame buffer 1012 may retrieve the indications from the standby image storage when the input frame buffer 1012 is empty for use to display. The input frame buffer 1012 may provide the serial image data to a cyclic redundancy check (CRC) image analysis module 1014 of the processor, which may determine whether the serial image data buffered is valid. If so, the valid data may be supplied to a display frame buffer 1016.

Data from the CRC image analysis module 1014 and the display frame buffer 1016 may be supplied to the pixel driver 1020 to drive the LEDs 1042. In particular, the data from the CRC image analysis module 1014 may be supplied to a rising edge phase shift module 1024 of the pixel driver 1020 while data from the display frame buffer 1016 may be supplied to a pulse duration module 1022 of the pixel driver 1020. The rising edge phase shift module 1024 may also receive a PWM of a predetermined frequency from a PWM generator 1018. Thus, the CRC image analysis module 1014 data may be used by the rising edge phase shift module 1024 to determine how much to shift the rising edge of the PWM signal, while the data from the display frame buffer 1016 may be used to adjust the duration of the resulting PWM signal.

The resulting phase-shifted and duration-adjusted PWM signal may be supplied to a control terminal of an input transconductance device 1032. As shown the input transconductance device 1032 may be a p-channel enhancement type MOSFET, although other types of FETs or other devices may be used. Thus, the altered PWM signal may be supplied to the gate of the MOSFET 1032. The source of the MOSFET 1032 may be connected with the power supply Vcc. The drain of the MOSFET 1032 may be connected with an output of a comparator 1038 and with the control terminal of another MOSFET 1036. The inputs of the comparator 1038 may be a predetermined bias voltage and a voltage that is dependent on the altered PWM signal. The source of the MOSFET 1032 (and thus PWM signal) is coupled to one end of a resistor 1034 and the other end of the resistor 1034 may be coupled to another input of the comparator 1038 and the source of the other MOSFET 1036. The drain of the other MOSFET 1036 may be coupled to an amplifier 1040 before being supplied to the LEDs 1042. The drain of the other MOSFET 1036 may also be coupled to a switch 1044 to supply a feedback voltage to the control module 1010.

Figure 11:
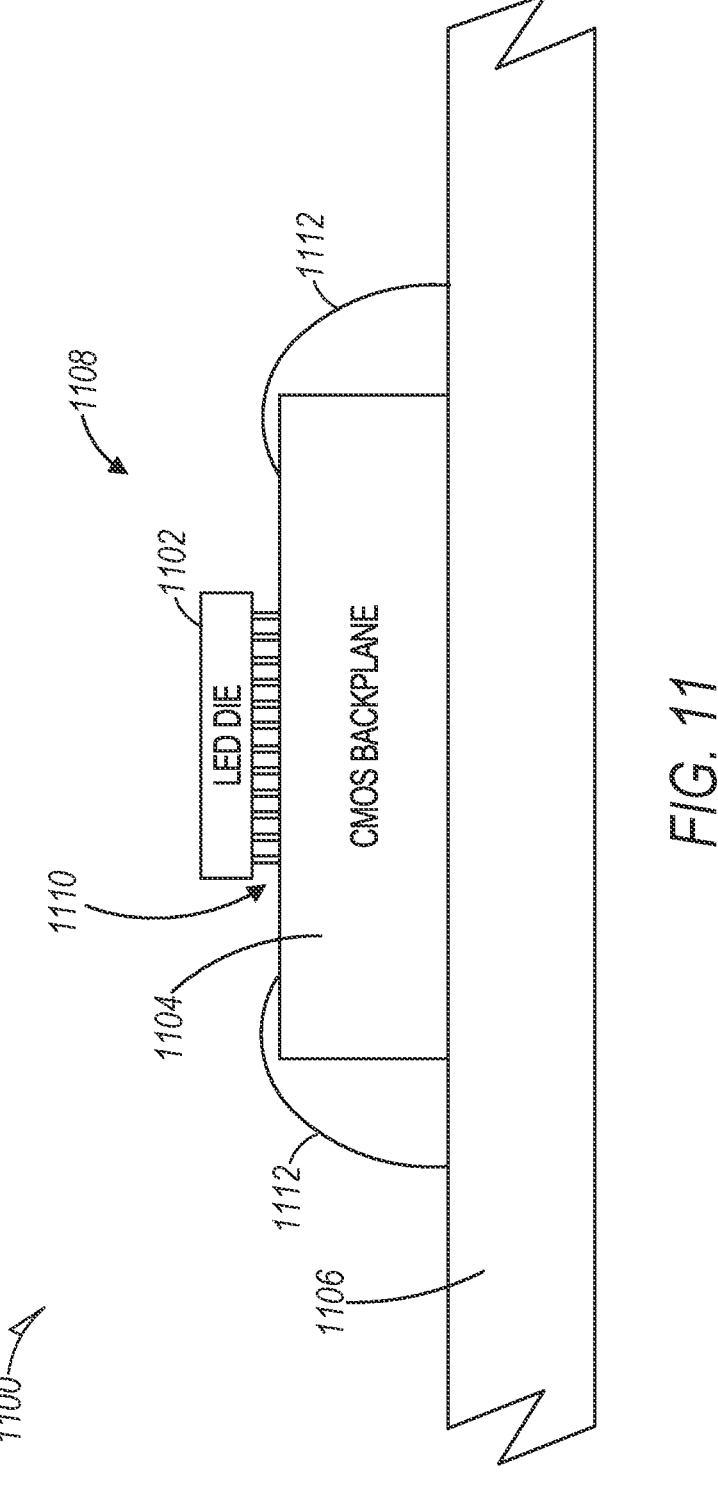
FIG. 11 illustrates an example hardware arrangement for implementing the systems herein, according to some embodiments.

FIG. 11 illustrates an example hardware arrangement 1100 for implementing the above disclosed subject matter, according to some embodiments. In particular, the hardware arrangement 1100 may illustrate hardware components that may implement the system 800. The hardware arrangement 1100 may include an integrated LED 1108. The integrated LED 1108 may include an LED die 1102 and a CMOS backplane 1104. The LED die 1102 may be coupled to the CMOS backplane 1104 by one or more interconnects 1110, where the interconnects 1110 may provide for transmission of signals between the LED die 1102 and the CMOS backplane 1104. The interconnects 1110 may comprise one or more solder bump joints, one or more copper pillar bump joints, other types of interconnects known in the art, or some combination thereof.

The LED die 1102 may include circuitry to implement the micro-LED array. In particular, the LED die 1102 may include a plurality of micro-LEDs. The LED die 1102 may include a shared active layer and a shared substrate for the micro-LED array, and thereby the micro-LED array may be a monolithic micro-LED array. Each micro-LED of the micro-LED array may include an individual segmented active layer and/or substrate. In some embodiments, the LED die 1102 may further include switches and current sources to drive the micro-LED array. In other embodiments, the PWM switches and the current sources may be included in the CMOS backplane 1104.

The CMOS backplane 1104 may include circuitry to implement the control module and/or the LED power supply. The CMOS backplane 1104 may utilize the interconnects 1110 to provide the micro-LED array with the PWM signals and the signals for the intensity for causing the micro-LED array to produce light in accordance with the PWM signals and the intensity. Because of the relatively large number and density of connections to drive the micro-LED array compared to standard LED arrays, different embodiments may be used to electrically connect the CMOS backplane 1104 and the LED die 1102. Either the bonding pad pitch of the CMOS backplane 1104 may be the same as the pitch of bonding pads in the micro-LED array, or the bonding pad pitch of the CMOS backplane 1104 may be larger than the pitch of bonding pads in the micro-LED array.

The hardware arrangement 1100 may further include a PCB 1106. The PCB 1106 may include circuitry to implement functionality such as that shown in, for example, FIG. 8 (the power protection 816, the processor power 818, the sensor module 806, the transceiver 808, the processor 810, or portions thereof). The PCB 1106 may be coupled to the CMOS backplane 1104. For example, the PCB 1106 may be coupled to the CMOS backplane 1104 via one or more wire bonds 1112. The PCB 1106 and the CMOS backplane 1104 may exchange image data, power, and/or feedback via the coupling, among other signals.

As shown, the micro-LEDs and circuitry supporting the micro-LED array can be packaged and include a submount or printed circuit board for powering and controlling light production by the micro-LEDs. The PCB 1106 supporting the micro-LED array may include electrical vias, heat sinks, ground planes, electrical traces, and flip chip or other mounting systems. The submount or PCB may be formed of any suitable material, such as ceramic, silicon, aluminum, etc. If the submount material is conductive, an insulating layer may be formed over the substrate material, and a metal electrode pattern formed over the insulating layer for contact with the micro-LED array. The submount can act as a mechanical support, providing an electrical interface between electrodes on the micro-LED array and a power supply, and also provide heat sink functionality.

As above, a variety of applications may be supported by micro-LED arrays. Such applications may include a stand-alone applications to provide general illumination (e.g., within a room or vehicle) or to provide specific images. In addition to devices such as a luminaire, projector, mobile device, the system may be used to provide either augmented reality (AR) and virtual reality (VR)-based applications. Various types of devices may be used to provide AR/VR to users, including headsets, glasses, and projectors. Such an AR/VR system may include components similar to those described above: the micro-LED array, a display or screen (which may include touchscreen elements), a micro-LED array controller, sensors, and a controller, among others. The AR/VR components can be disposed in a single structure, or one or more of the components shown can be mounted separately and connected via wired or wireless communication. Power and user data may be provided to the controller. The user data input can include information provided by audio instructions, haptic feedback, eye or pupil positioning, or connected keyboard, mouse, or game controller. The sensors may include cameras, depth sensors, audio sensors, accelerometers, two or three axis gyroscopes and other types of motion and/or environmental/wearer sensors that provide the user input data. Other sensors can include but are not limited to air pressure, stress sensors, temperature sensors, or any other suitable sensors for local or remote environmental monitoring. In some embodiments, the control input can include detected touch or taps, gestural input, or control based on headset or display position. As another example, based on the one or more measurement signals from one or more gyroscope or position sensors that measure translation or rotational movement, an estimated position of the AR/VR system relative to an initial position can be determined.

In some embodiments, the controller may control individual micro-LEDs or one or more micro-LED pixels (groups of micro-LEDs) to display content (AR/VR and/or non-AR/VR) to the user while controlling other micro-LEDs and sensors used in eye tracking to adjust the content displayed. Content display micro-LEDs may be designed to emit light within the visible band (approximately 400 nm to 780 nm) while micro-LEDs used for tracking may be designed to emit light in the IR band (approximately 780 nm to 2,200 nm). In some embodiments, the tracking micro-LEDs and content micro-LEDs may be simultaneously active. In some embodiments, the tracking micro-LEDs may be controlled to emit tracking light during a time period that content micro-LEDs are deactivated and are thus not displaying content to the user. The AR/VR system can incorporate optics, such as those described above, and/or an AR/VR display, for example to couple light emitted by micro-LED array onto the AR/VR display.

In some embodiments, the AR/VR controller may use data from the sensors to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow. Based on changes in position, orientation, or movement of the AR/VR system, the system controller can send images or instructions the light emitting array controller. Changes or modification the images or instructions can also be made by user data input, or automated data input.

Figure 12:
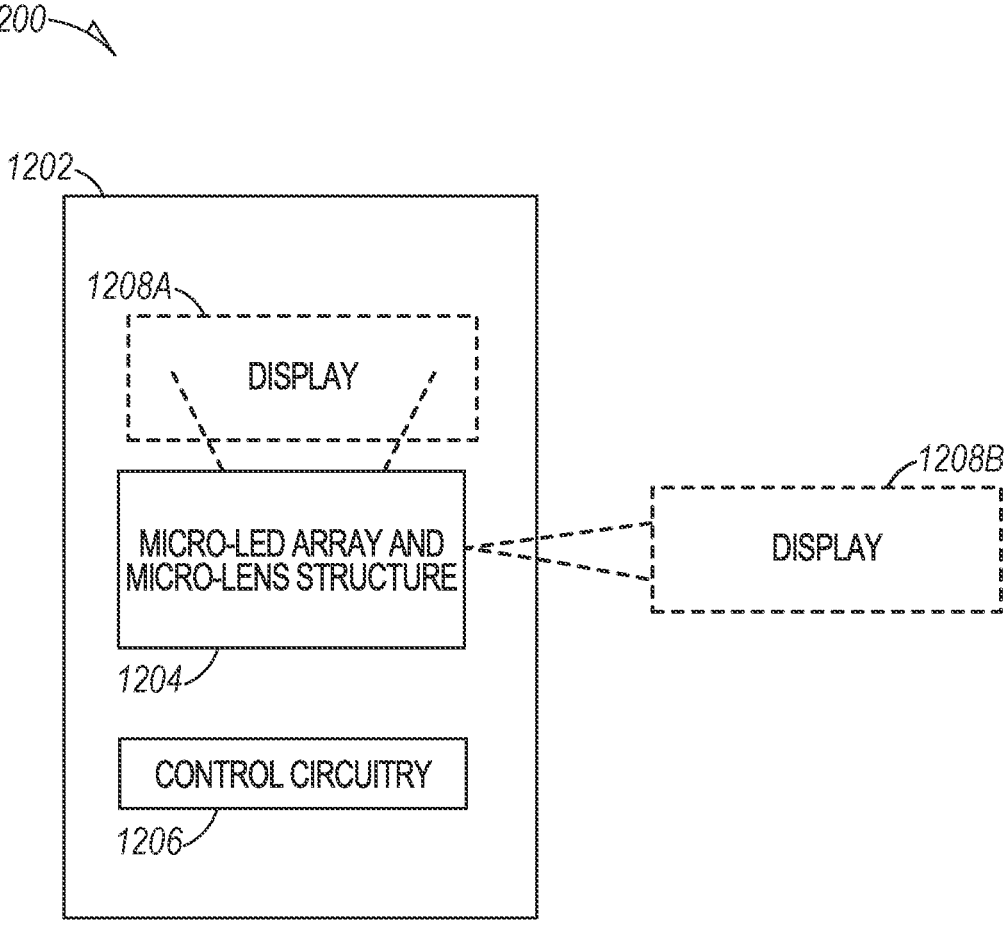
FIG. 12 illustrates an example system, according to some embodiments.

FIG. 12 illustrates an example system, according to some embodiments. The system 1200 shown in FIG. 12 may include some or all of the components, modules and circuitry described herein. The system 1200 may contain a device 1202 that includes the micro-LED array and micro-lens structure 1204 described herein. Control circuitry 1206 used to control output of the micro-LED array and micro-lens structure 1204 may include a processor, PWM circuitry, switches, and others described above and operate similarly. The device 1202 may contain a display 1208a, such as a touchscreen, and/or an external display 1208b may be used to display the light from the micro-LED array and micro-lens structure 1204.

Figure 13:
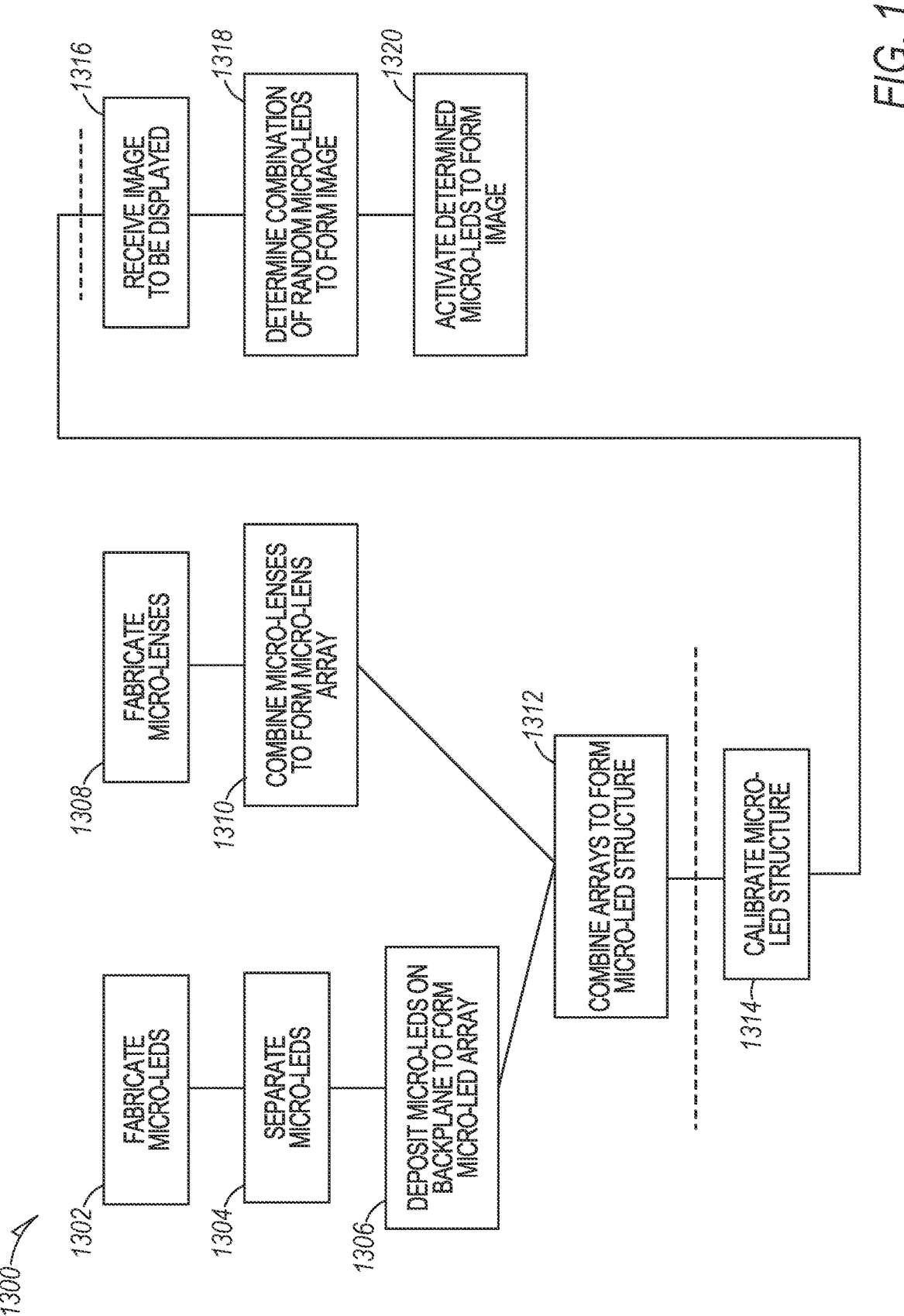
FIG. 13 illustrates an example method, according to some embodiments.

FIG. 13 illustrates an example method, according to some embodiments. Not all of the operations may be undertaken in the method 1300 of FIG. 13, and/or additional operations may be present. The method 1300 is separated into three stages. The first stage includes fabrication of the micro-LED structure, the second stage includes calibration of the micro-LED structure, and the third stage includes display of a desired image. The various stages may be undertaken by different entities.

In the first stage, the micro-LEDs are fabricated at operation 1302. Semiconductor fabrication processes (e.g., chemical vapor deposition, metal deposition, oxide growth, etching) may be used to fabricate a regular array of the micro-LEDs at operation 1302. The regular array may be separated at operation 1304 by scribing or otherwise dissolving the connections between the micro-LEDs. The individual micro-LEDs may be suspended in a liquid and deposited randomly on a backplane to form the micro-LED array at operation 1306. The micro-LEDs may have a random placement, distribution, and/or orientation. The individual micro-lenses may be fabricated at operation 1308. The individual micro-lenses may be formed from glass or another structure that provides the desired characteristics. The individual micro-lenses may have the same or similar characteristics of at least one of the characteristics (e.g., diameter, focal length) may be random. The individual micro-lenses may be combined to form the micro-lens array at operation 1310. The micro-lens array may be formed in a regular array or may be disposed in a random array (micro-lenses of random characteristics) that contact each other. Once the micro-LED array and the micro-lens array have been fabricated, they may be combined at operation 1312 into a single micro-LED structure and placed in a device or other cavity and connected to the circuitry to control the micro-LED array structure.

In the second stage, the micro-LED structure is calibrated at operation 1314. The processor may individually activate each micro-LED and the light may be detected, recorded, and stored for later processing.

In the third stage, at operation 1316, an image to be display is received. The image may be predetermined, user-controlled, or otherwise set. At operation 1318, the processor may determine which of the random micro-LEDs to activate and combine to form the desired image. At operation 1320, the control circuitry and power circuitry may be used to activate only those micro-LEDs determined by the processor to form the desired image.

In the detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function.

The description uses the phrases "in an embodiment" or "in embodiments," which may each refer to one or more of the same or different embodiments. Furthermore, the terms "comprising," "including," "having," and the like, as used with respect to embodiments, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope. In certain cases, it may be easier to describe one or more of the functionalities of a given set of flows by only referencing a limited number of electrical elements.

As used herein, the states of switches may be referred to as "open" and "closed." In some embodiments, a switch may comprise a physical throw, where the term "open" may refer to the throw opening the circuit in which the switch is implemented preventing the flow of current and the term "closed" may refer to the throw completing the circuit in which the switch is implemented allowing the flow of current. In some embodiments, a switch may comprise a transistor, where the term "open" may refer to the transistor presenting a high resistance that allows a minimal amount of current to flow and the term "closed" may refer to the transistor presenting that allows a large amount of current to flow. Further, when referring to a switch comprising a transistor allowing current flow or preventing current flow, it should be understood that current flow when the switch is allowing current flow may be an amount of current flow through the transistor when "closed" and the current flow when the switch is preventing current flow may be an amount of current flow through the transistor when "open" (which may be non-zero in some instances). It should be understood that the amount of current allowed to the flow through the transistor when "open" and when "closed" can be dependent on the characteristics of the transistor, and the terms "open" and "closed" are to be interpreted as one having ordinary skill in the art would understand when referring to a transistor being utilized as a switch.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on a particular configuration, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, components and/or procedures described herein may be implemented in one or more silicon cores in Application Specific Integrated Circuits (ASICs), Field Programmable Gate Arrays (FPGAs), and other semiconductor chips.

It is also important to note that the functions related to components and/or procedures described herein and/or the procedure may illustrate some of the possible functions that may be executed by, or within, the systems described herein Some of these operations may be deleted or removed where appropriate, or these operations may be modified or changed considerably without departing from the scope. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

The invention claimed is:

1. A micro-light-emitting diode (LED) array system, the micro-LED array system comprising:
   a micro-LED array that includes a plurality of micro-LEDs, the micro-LEDs having random orientations, random distributions, and random positions;
   a lens array that includes a plurality of micro-lenses, the lens array configured to capture light from the micro-LEDs, each of the micro-lenses having at least one random characteristic including one or more of diameter, shape, focal length, pitch, or position; and
   a processor configured to:
      individually drive each of the micro-LEDs to generate an illumination profile; and
      determine which of the micro-LEDs to activate using a linear combination of the micro-LEDs based on matrix inversion.

2. The micro-LED array system of claim 1, wherein each micro-lens is aligned with at least one of the micro-LEDs.

3. The micro-LED array system of claim 2, wherein at least a center of at least one of the micro-LEDs is not colinear with a center of the micro-lens aligned with the at least one of the micro-LEDs.

4. The micro-LED array system of claim 1, wherein the micro-LED array is disposed at a focal plane of the lens array.

5. The micro-LED array system of claim 1, wherein at least some of the micro-LEDs emit light of different colors.

6. The micro-LED array system of claim 1, further comprising:

a printed circuit board (PCB), wherein the processor is disposed on the PCB.

7. The micro-LED array system of claim 1, wherein the processor is further configured to:

receive a user-provided illumination profile that includes an illumination color temperature and intensity profile, determine a linear combination of the micro-LEDs to generate the user-provided illumination profile, and calculate currents for the micro-LEDs and drive the micro-LEDs based on the user-provided illumination profile.

8. The micro-LED array system of claim 1, further comprising:

a camera coupled to the processor;

a memory coupled to the processor; and a power supply coupled to the processor, wherein during calibration:

the processor is further configured to control the power supply to individually activate each of the micro-LEDs, determine an individual illumination component of each of the micro-LEDs activated by the power supply and captured by the camera, and record the individual illumination component in the memory.

9. The micro-LED array system of claim 1, further comprising a reflector surrounding the micro-LED array to reflect light from the micro-LEDs towards the lens array.

10. The micro-LED array system of claim 1, wherein each of the micro-lenses has at least one identical characteristic.

11. A method of operating a micro-LED array, the method comprising:

calibrating the micro-LED array by capturing light from a micro-LED array structure, the micro-LED array structure comprising a micro-LED array that includes a plurality of micro-LEDs having random orientations, random distributions, and random positions, and a lens array that includes a plurality of micro-lenses configured to capture light from the micro-LEDs, the calibration including capturing the light from each of the micro-LEDs at different times and determining characteristics of the light from each of the micro-LEDs;

receiving image data of an image to be generated by the micro-LED array;

determining which of the micro-LEDs to activate and characteristics of the activation to generate the image using a linear combination of the micro-LEDs based on matrix inversion; and activating the micro-LEDs to form the image.

12. The micro-LED array system of claim 1, wherein each of the micro-lenses has a random diameter, shape, focal length, pitch, and position.

13. The micro-LED array system of claim 1, wherein each of the micro-lenses are disposed in a single plane having an identical distance to the micro-LED array.

14. The micro-LED array system of claim 1, wherein each of the micro-lenses has a shape that is randomly selected among a predetermined set of shapes.

15. The method of claim 11, wherein each micro-lens has at least one random characteristic including one or more of diameter, shape, focal length, pitch, or position.

16. The micro-LED array system of claim 1, wherein the processor is configured to determine a linear combination of the micro-LEDs for an arbitrary illumination profile based on a partial illumination component provided by each of the micro-LEDs.

17. A micro-light-emitting diode (LED) array system, the micro-LED array system comprising:

a micro-LED array that includes a plurality of micro-LEDs arranged in cells, the micro-LEDs within each cell of the array having random orientations, and at least one of a random distribution or random position at predetermined locations;

a lens array that includes a plurality of micro-lenses, the lens array configured to capture light from the micro-LEDs, each of the micro-lenses having at least one random characteristic including one or more of diameter, shape, focal length, pitch, or position; and a processor configured to generate an illumination profile via a determination of which of the micro-LEDs to activate using a linear combination of the micro-LEDs based on matrix inversion, wherein the processor is configured to determine a linear combination of the micro-LEDs for an arbitrary illumination profile based on a partial illumination component provided by each of the micro-LEDs.

* * * * *